US006662352B2

(12) United States Patent
Nsame et al.

(10) Patent No.: US 6,662,352 B2
(45) Date of Patent: Dec. 9, 2003

(54) METHOD OF ASSIGNING CHIP I/O'S TO PACKAGE CHANNELS

(75) Inventors: Pascal A. Nsame, Colchester, VT (US); Faraydon Pakbaz, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 09/682,474

(22) Filed: Sep. 6, 2001

(65) Prior Publication Data

US 2003/0061589 A1 Mar. 27, 2003

(51) Int. Cl.[7] .............................................. G06F 17/50
(52) U.S. Cl. ................................. 716/14; 716/1; 716/5
(58) Field of Search ................................ 716/14, 1–13, 716/15

(56) References Cited

U.S. PATENT DOCUMENTS

| | | | |
|---|---|---|---|
| 3,644,937 A | | 2/1972 | Isett |
| 5,231,589 A | * | 7/1993 | Itoh et al. |
| 5,331,572 A | | 7/1994 | Takahashi |
| 5,666,289 A | | 9/1997 | Watkins |
| 5,801,955 A | | 9/1998 | Burgun et al. |
| 5,838,060 A | * | 11/1998 | Comer |
| 6,090,151 A | | 7/2000 | Gehman et al. |
| 6,216,252 B1 | | 4/2001 | Dangelo et al. |
| 6,230,299 B1 | | 5/2001 | McSherry et al. |
| 6,292,766 B1 | * | 9/2001 | Mattos et al. |
| 6,480,817 B1 | * | 11/2002 | Peters et al. |

OTHER PUBLICATIONS

Cadence Website: IC Packaging—Advanced Packaging Engineer and Advanced Package Designer. http://www.dadencepcb.com/products/icpackaging/datasheets/default.asp, Sep. 2000.*

Hobbs, J.M., et al "Simultaneous Switching Noise Suppression for High Speed Systems Using Embedded Decoupling", Electronic Components and Technology Conference, May 29–Jun. 1, 2001 pp. 339–343.*

Ansoft Corporation website (www.ansoft.com): Ansoft Releases New Version of Turbo Package Analyzer (TPA)—Sep. 18, 2000.*

Ansoft Corporation website (www.ansoft.com): Industry First "Multipole—Accelerated PEEC" Engine Debuts in TPA V4.0—Jun. 18, 2001.*

T. W. Her, Pin Assignment with Timing Consideration, 0–7803–3073–0/96/1996 IEEE, pp. 695–698, 774.

W. E. Donath, I/O Pin Assignment in a Computer, IBM Technical Disclosure Bulletin, vol. 25, No. 3B, Aug. 1982, pp. 1720–1724.

Harvatis et al., Pin Assignment for High–Performance MCM Systems, 0–7803–3073–0/96/1996 IEEE, pp. 771–773.

* cited by examiner

*Primary Examiner*—Vuthe Siek
*Assistant Examiner*—Magid Y Dimyan
(74) *Attorney, Agent, or Firm*—Schmeiser, Olsen & Watts; Richard A. Henkler

(57) ABSTRACT

Disclosed is a method of allowing a user to assign I/O cells of an integrated circuit chip to package channels of a package, comprising: calculating package RLC values for each package channel in the package; and assigning each I/O cell to one or more package channels based on the calculated package RLC values of the package channels.

20 Claims, 11 Drawing Sheets

RLC FILE (PACKAGE) 200

| PKG PIN | LENGTH (um) | R (mohm) | L (nH) | C (pF) |
|---|---|---|---|---|
| D24 | 15212 | 546 | 5.00 | 2.50 |
| D25 | 16500 | 596 | 5.37 | 2.69 |
| B26 | 19431 | 709 | 6.22 | 3.12 |
| B27 | 20289 | 742 | 6.46 | 3.25 |
| A27 | 21591 | 792 | 6.84 | 3.44 |
| J20 | 7563 | 252 | 2.81 | 1.37 |
| C26 | 18905 | 688 | 6.06 | 3.05 |
| E24 | 16661 | 602 | 5.42 | 2.71 |
| 0 | 0 | 0 | 0 | 0 |
| 0 | 0 | 0 | 0 | 0 |

*FIG. 5A*

RLC FILE (CHIP) 200A

| CHIP PAD | LENGTH (mm) | R (ohm) | L (nH) | C (pF) |
|---|---|---|---|---|
| D24 | 0.2 | 0.3 | 0.1 | 0.5 |
| D25 | 0.1 | 0.2 | 0.1 | 0.3 |
| B26 | 0.4 | 0.5 | 0.3 | 0.8 |
| B27 | 0.1 | 0.1 | 0.0 | 0.1 |
| A27 | 0.3 | 0.3 | 0.2 | 0.6 |
| J20 | 0.6 | 0.7 | 0.4 | 1.0 |
| E24 | 0.4 | 0.5 | 0.3 | 0.7 |
| C26 | 0.7 | 0.9 | 0.5 | 1.2 |
| 0 | 0 | 0 | 0 | 0 |
| 0 | 0 | 0 | 0 | 0 |

*FIG. 5B*

XREF (RELATED ART) → 210A

| SEQ | I/O CELL | CHIP PAD | PKG PIN | FUNCTION | I/O ORIGIN X | I/O ORIGIN Y |
|---|---|---|---|---|---|---|
| 1 | S001 | AA01 | D24 | SIG | 610.4 | 17.6 |
| 2 | S002 | AB02 | D25 | SIG | 668.0 | 17.6 |
| 3 | S003 | AB04 | B26 | SIG | 725.6 | 17.6 |
| 4 | S004 | AC03 | A27 | SIG | 783.2 | 17.6 |
| 5 | S005 | AC01 | B27 | TST | 840.8 | 17.6 |
| 6 | S006 | AC05 | J20 | TST | 898.4 | 17.6 |
| 7 | S007 | AD06 | E24 | SIG | 956.0 | 17.6 |
| 8 | S008 | AD04 | C26 | SIG | 1013.6 | 17.6 |
| 0 | 0 | 0 | 0 | 0 | 0 | 0 |
| 0 | 0 | 0 | 0 | 0 | 0 | 0 |

FIG. 7A

MOD XREF (INVENTION) → 210

| SEQ | I/O CELL | CHIP PAD | PKG PIN | FUNCTION | I/O ORIGIN X | I/O ORIGIN Y |
|---|---|---|---|---|---|---|
| 1 | S001 | AA01 | D24 | SIG | 610.4 | 17.6 |
| 2 | S002 | AB02 | D25 | SIG | 668.0 | 17.6 |
| 3 | S003 | AB04 | B26 | SIG | 725.6 | 17.6 |
| 4 | *S004* | *AJ01* | *G27* | *FIO* | *2056.4* | *34.2* |
| 5 | S005 | AC01 | B27 | TST | 840.8 | 17.6 |
| 6 | S006 | AC05 | J20 | TST | 898.4 | 17.6 |
| 7 | S007 | AD06 | E24 | SIG | 956.0 | 17.6 |
| 8 | S008 | AD04 | C26 | SIG | 1013.6 | 17.6 |
| 0 | 0 | 0 | 0 | 0 | 0 | 0 |
| 0 | 0 | 0 | 0 | 0 | 0 | 0 |

FIG. 7B

METHOD OF ASSIGNING CHIP I/O'S TO PACKAGE CHANNELS

BACKGROUND OF THE INVENTION

1. Field of the Invention

The present invention relates to the design of integrated circuit devices; more specifically, it relates to a method for selecting and assigning integrated circuit chip I/O's to package pins based on electrical properties of package channels.

2. Background of the Invention

The design of integrated circuit devices includes designing integrated circuit chips, designing chip packages and assigning I/O cells and power inputs to specific package pins. Generally, floor planning of the integrated circuit chips is performed after assignment of package pins to minimize signal delays to and from I/O cells and ensure adequate power distribution.

Historically a static timing analysis would be performed on the integrated circuit chip design to ensure that timing constraints were met. In modern design technique, static timing is based on determination of signal edge arrivals at the input of the I/O driver circuit and then in a separate simulation using a full netlist representation of the I/O driver and off-chip network, a determination of the delay from the input of the I/O driver circuit to the load on the network is performed. Such a simulation is very time consuming and only estimates the effect on timing of the package and other portions of the off-chip net. Further, package induced racing conditions are not accounted for. Of more concern, in the ASIC (application specific integrated circuit) environment, the simulation must be repeated for every chip/package combination.

A technique that would allow for characterization of a package in a manner that is applicable to different ASIC chips and accounted for actual delays in the package channels would save simulation time, reduce timing analysis failures which would require modifying the chip design and also increase the performance of the chip/package combination.

BRIEF SUMMARY OF THE INVENTION

Summary of the Invention

A first aspect of the present invention is a method of allowing a user to assign I/O cells of an integrated circuit chip to package channels of a package, comprising: calculating package RLC values for each package channel in the package; and assigning each I/O cell to one or more package channels based on the calculated package RLC values of the package channels.

A second aspect of the present invention is a computer system comprising a processor, an address/data bus coupled to said processor, and a computer-readable memory unit coupled to communicate with the processor, the memory unit containing instructions that when executed implement a method for allowing a user to assign I/O cells of an integrated circuit chip to package channels of a package, the method comprising the computer implemented steps of calculating package RLC values for each package channel in the package; and assigning each I/O cell to one or more package channels based on the calculated package RLC values of the package channels.

BRIEF DESCRIPTION OF THE SEVERAL VIEWS OF THE DRAWINGS

Brief Description of Drawings

Figure 1:
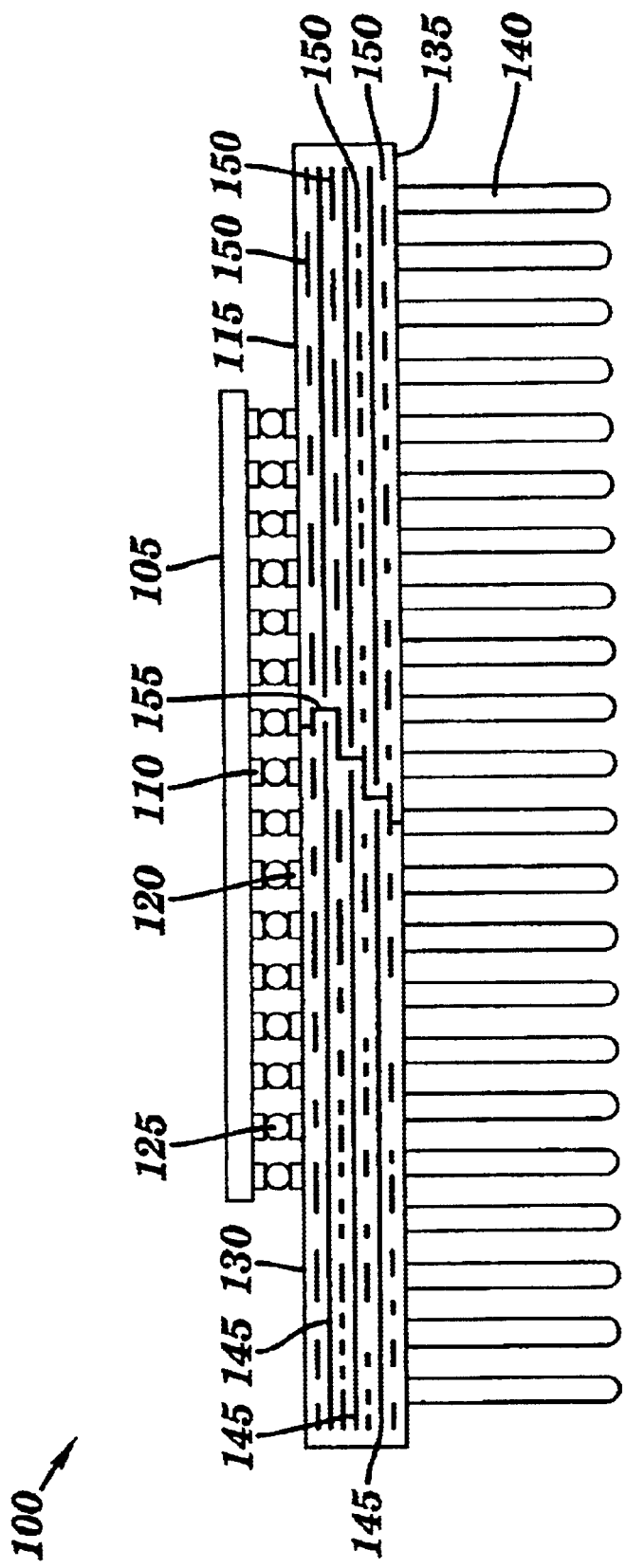
Figure 2:
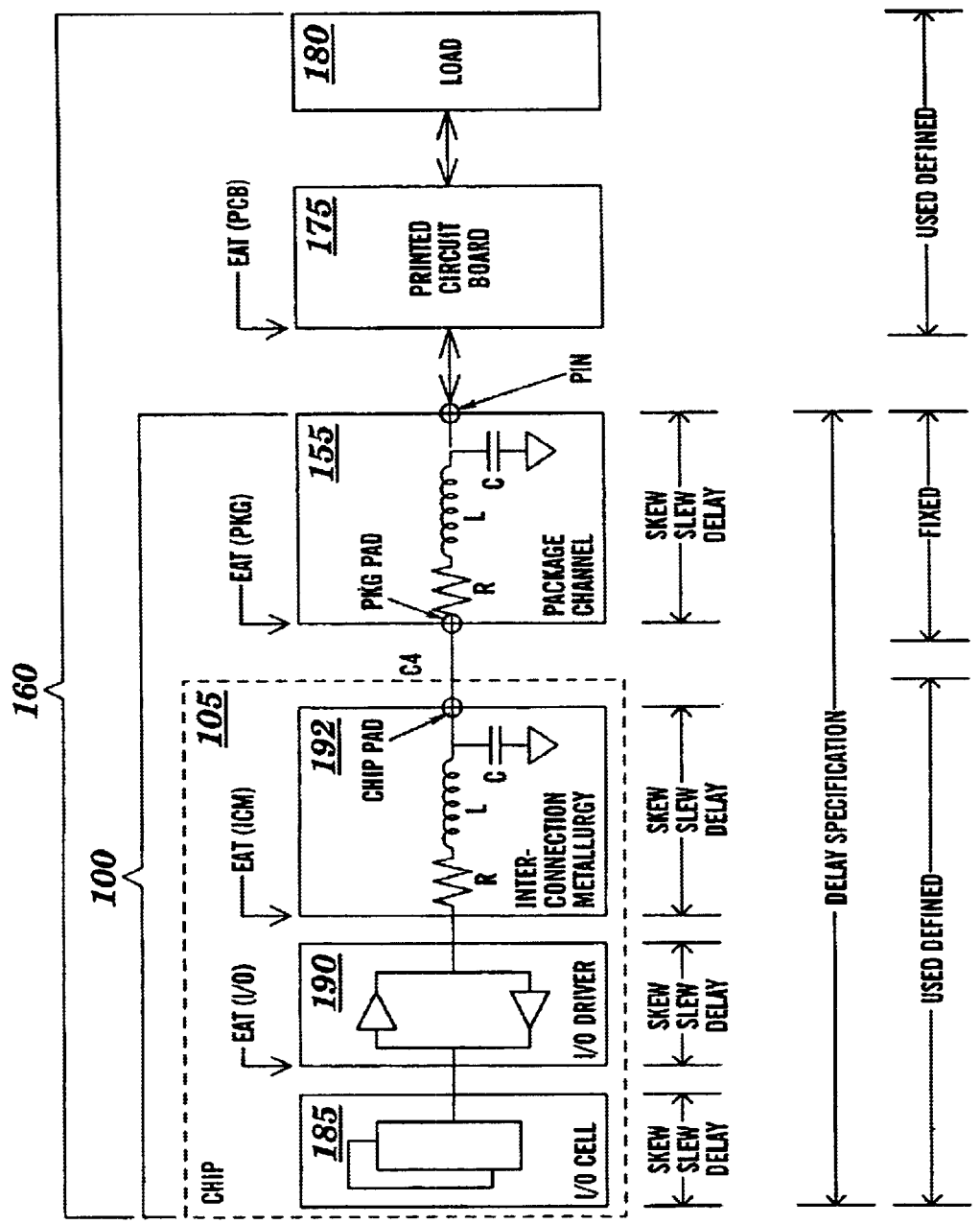
Figure 3:
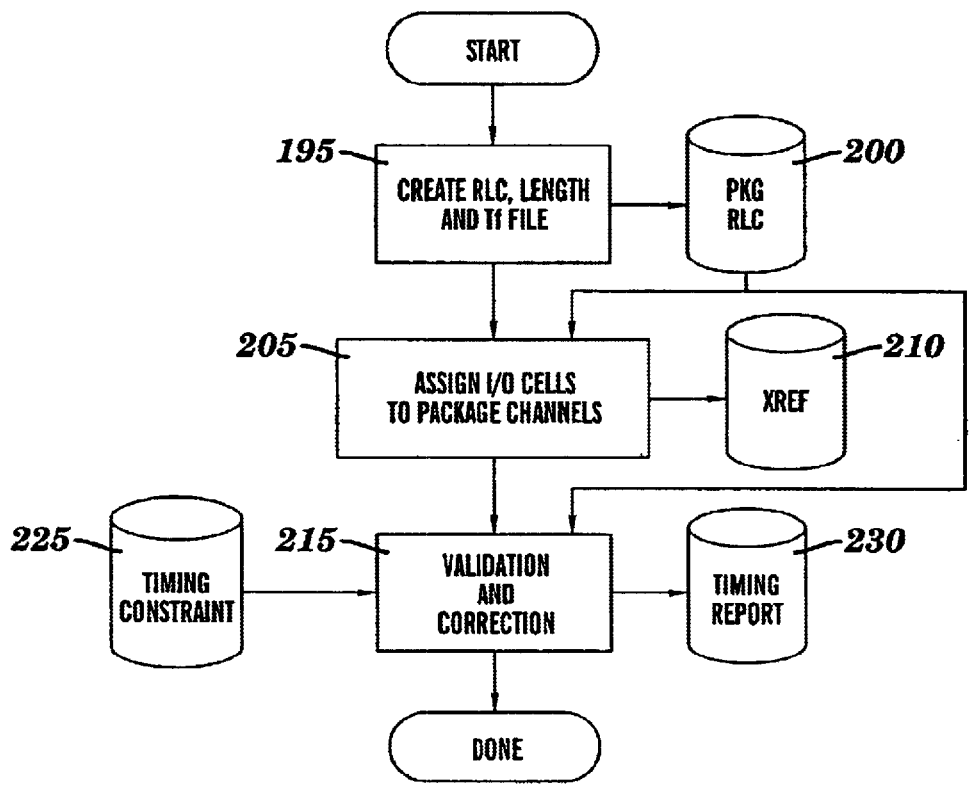
Figure 4:
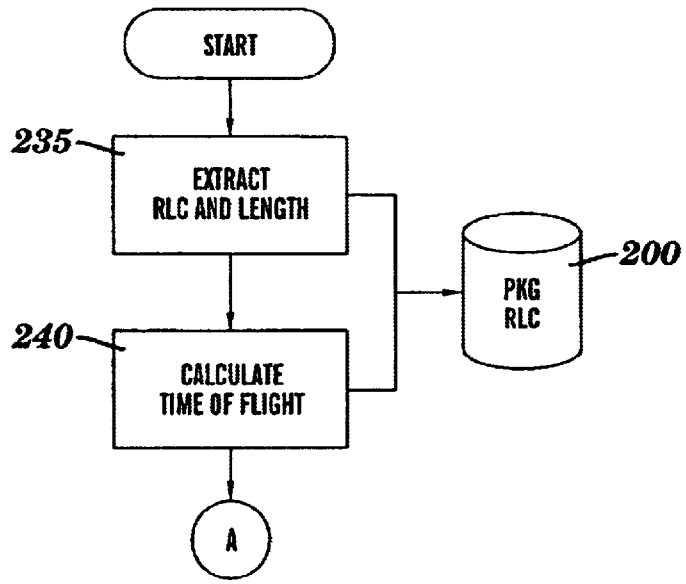
Figure 6:
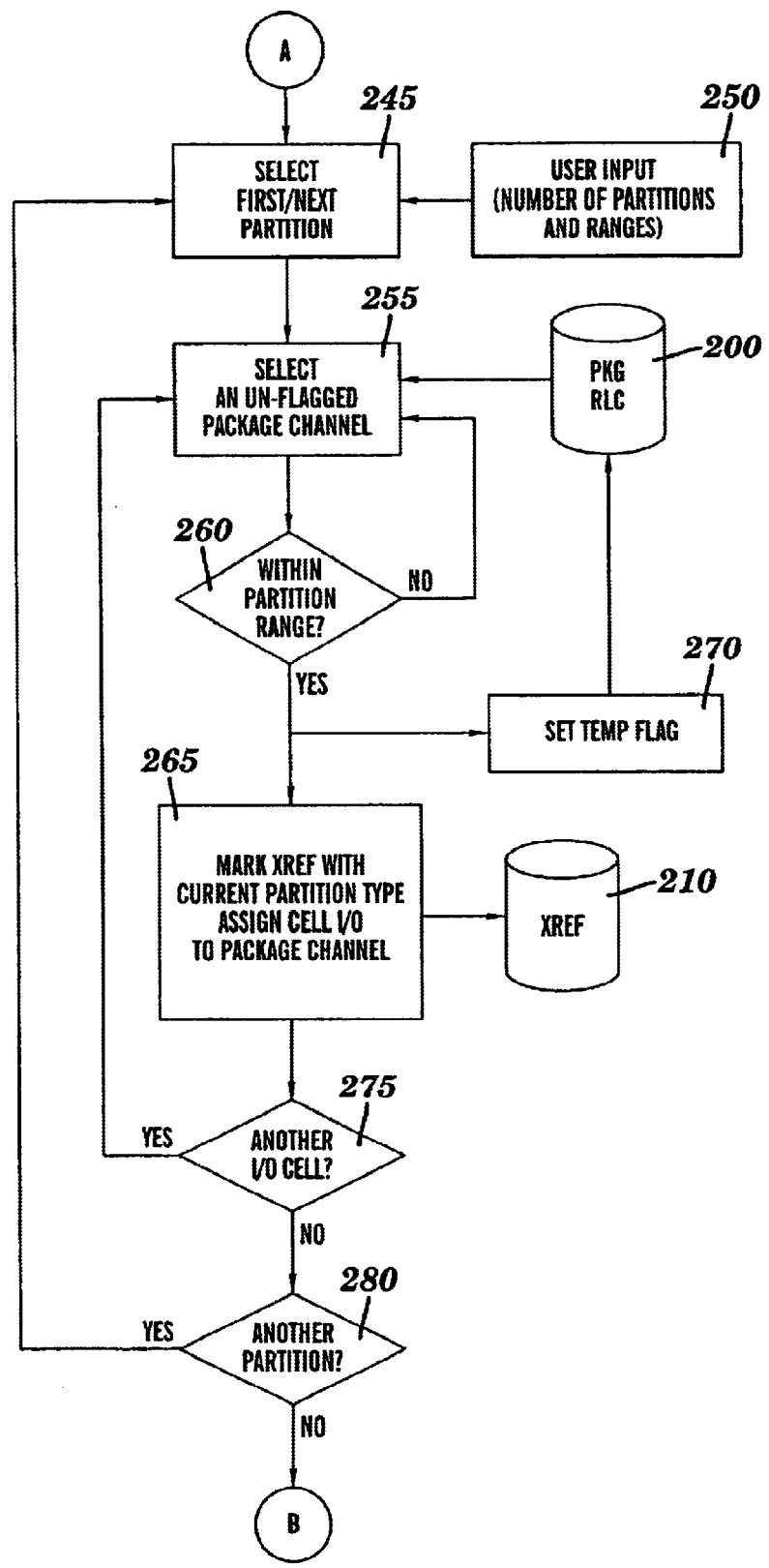
Figure 8:
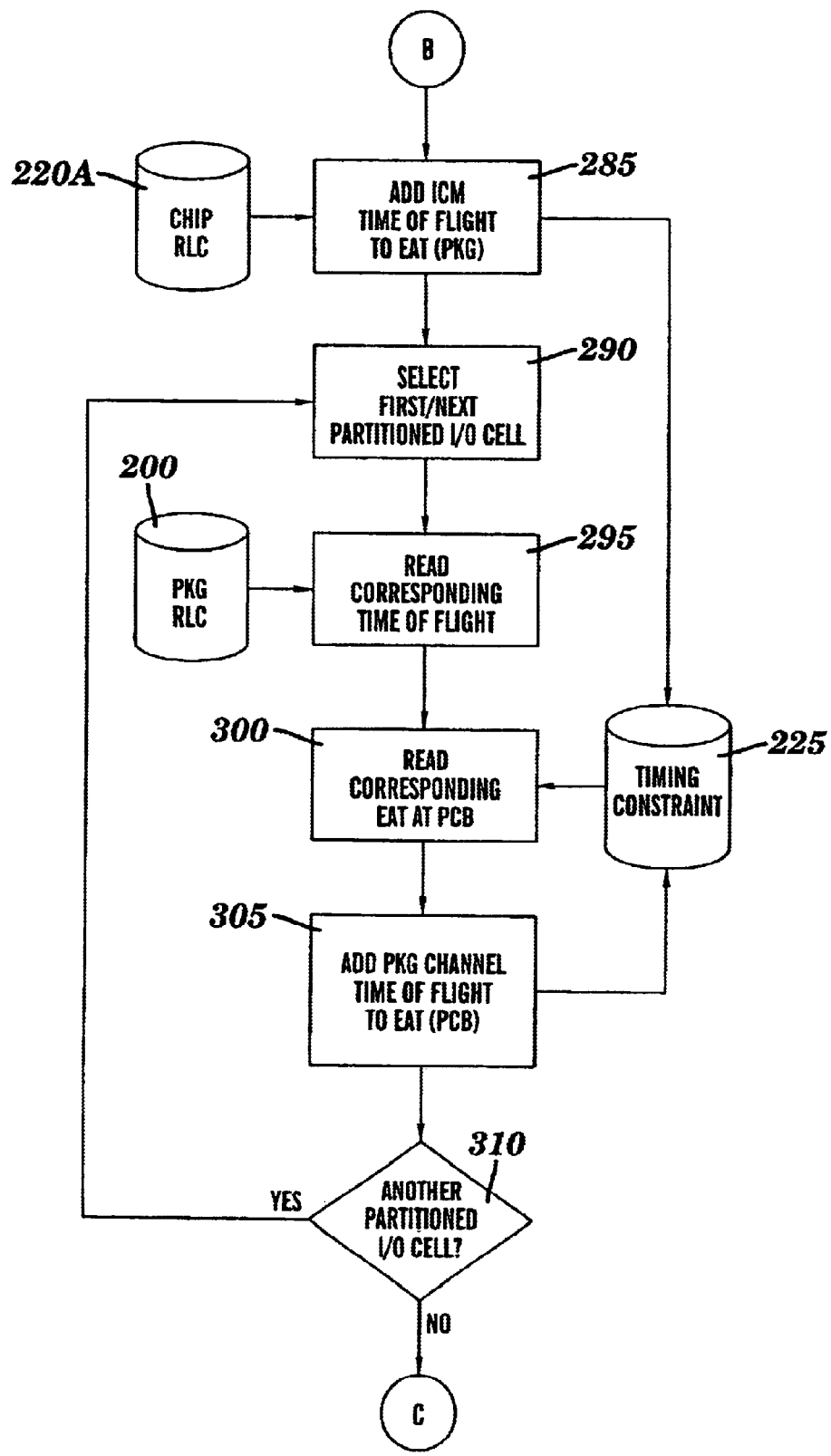
Figure 9:
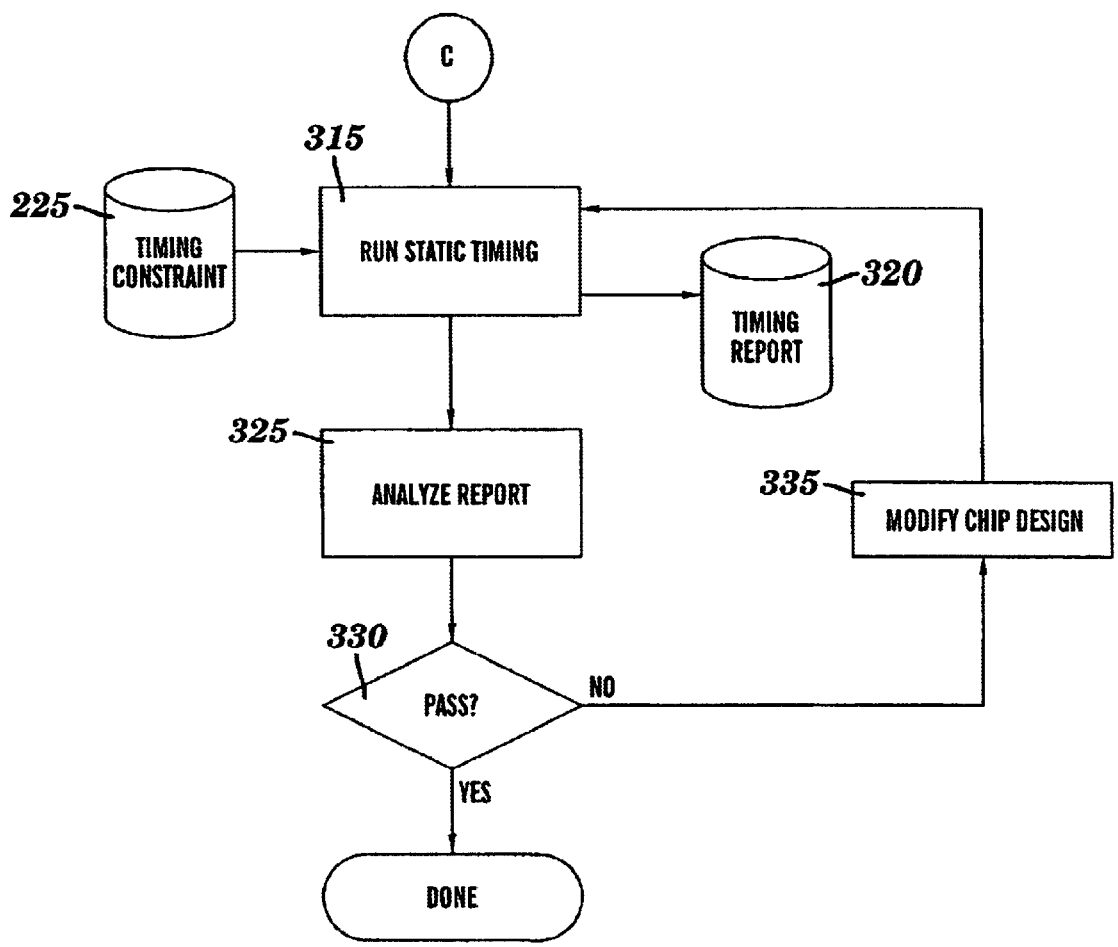
Figure 10:
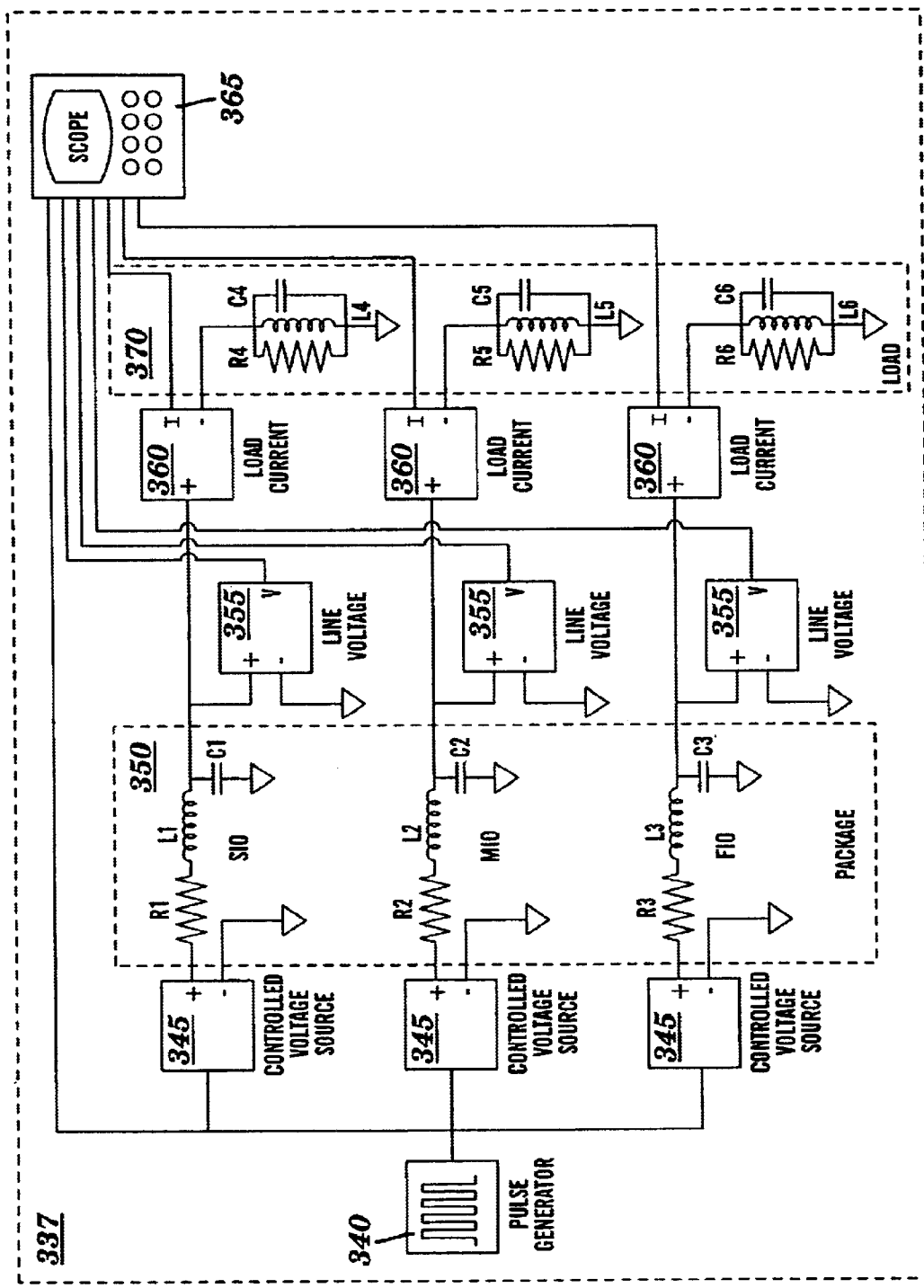
Figure 11:
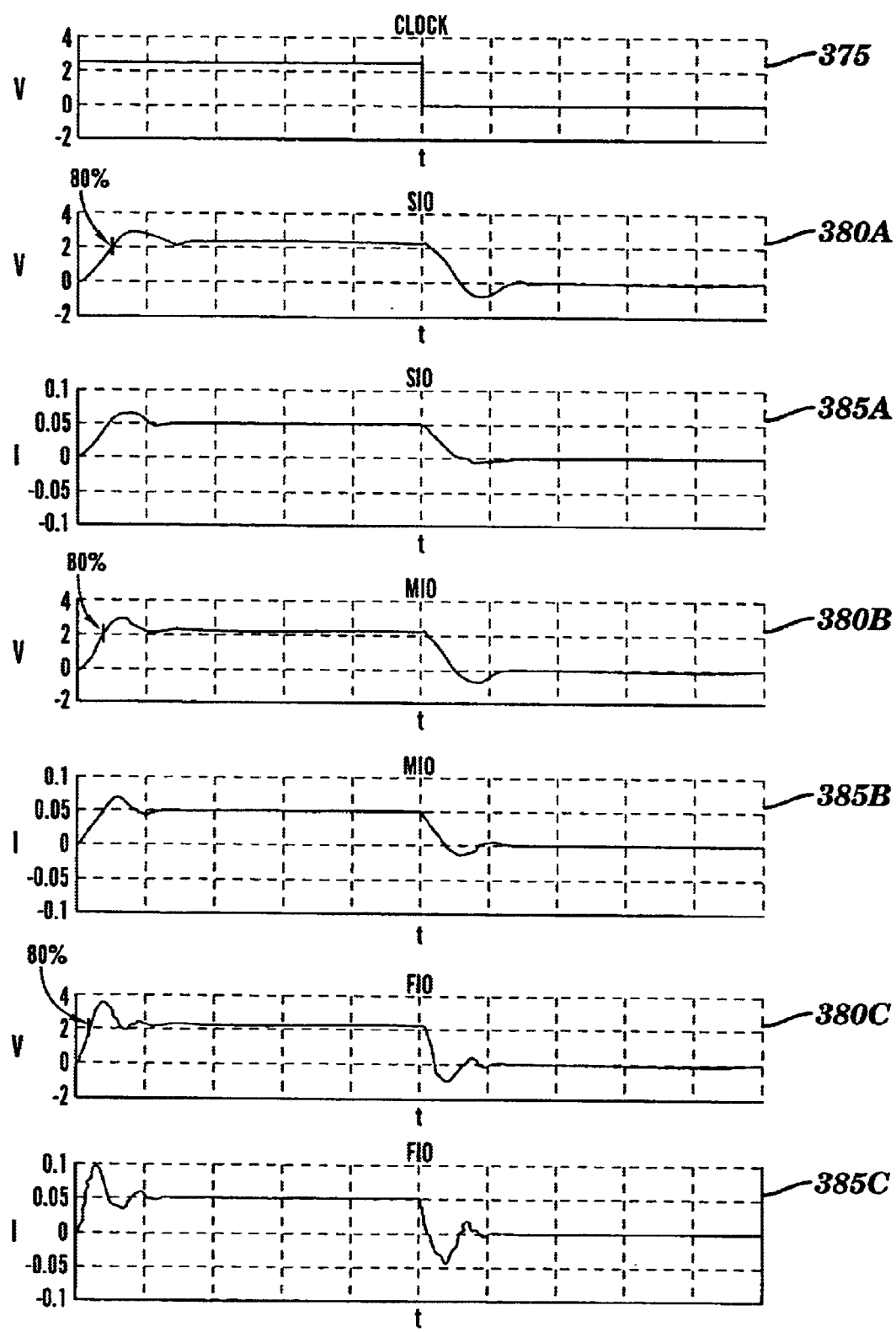
Figure 12:
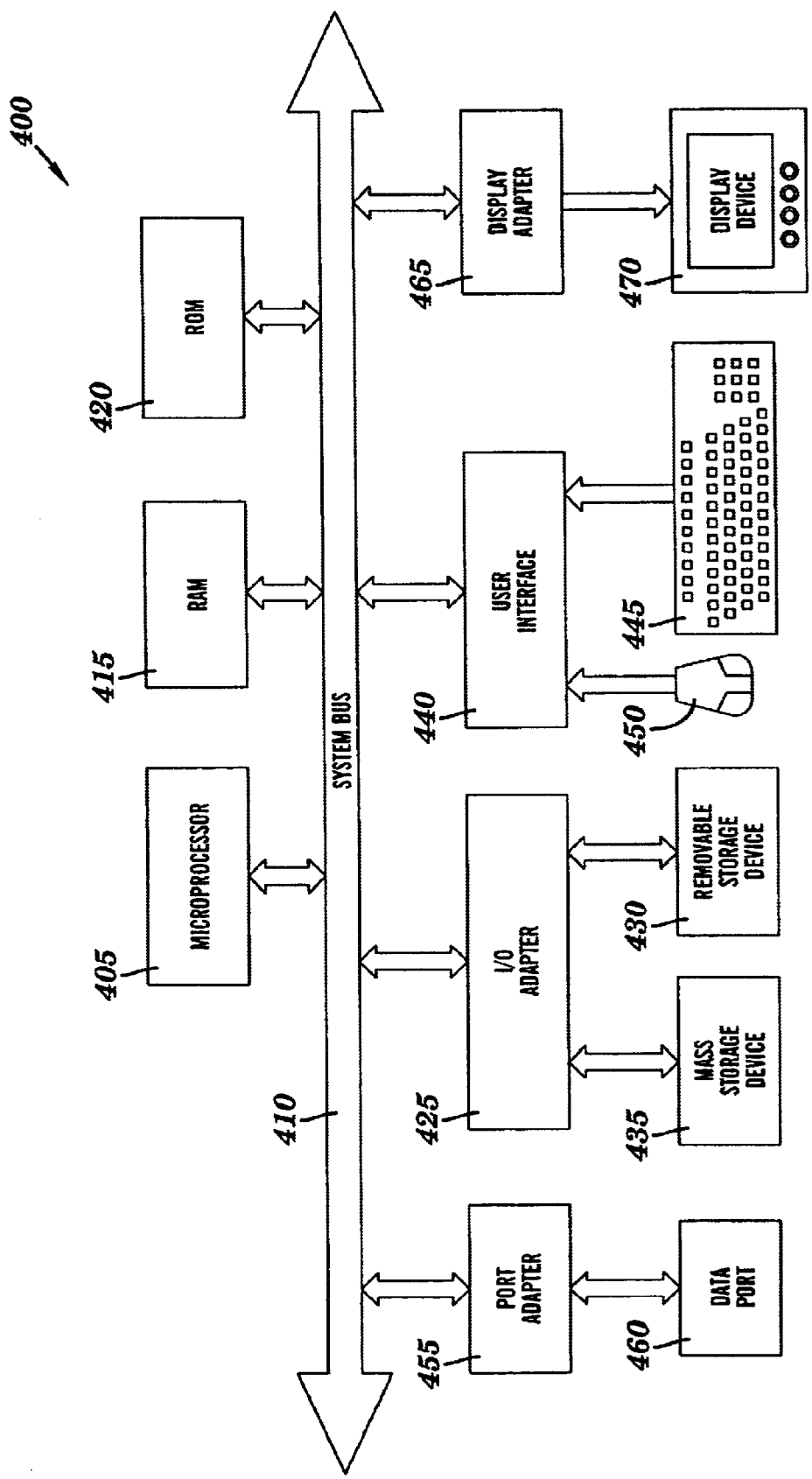

The features of the invention are set forth in the appended claims. The invention itself, however, will be best understood by reference to the following detailed description of an illustrative embodiment when read in conjunction with the accompanying drawings, wherein:

FIG. 1 is a cross-sectional view of an integrated circuit device according to the present invention;

FIG. 2 is a schematic diagram illustrating the delay elements of an electronic system according to the present invention;

FIG. 3 is a flowchart illustrating the method of selecting and assigning package channels to I/O cells according to the present invention;

FIG. 4 is a flowchart illustrating, in more detail, the method of step 195 of FIG. 3 for creating package RLC file according to the present invention;

FIG. 5A is an example of package RLC file 200 according to the present invention;

FIG. 5B is an example of an optional chip RLC file 200A according to the present invention;

FIG. 6 is a flowchart illustrating, in more detail, the method of step 205 of FIG. 3 for assigning I/O cells to package channels according to the present invention;

FIG. 7A is an example of a related art XREF file;

FIG. 7B is an example of XREF file 210 according to the present invention;

FIG. 8 is a flowchart illustrating, in more detail, a first portion of the method of step 215 of FIG. 3 for assigning chip I/Os according to the present invention;

FIG. 9 is a flowchart illustrating, in more detail, a second portion of the method of step 215 of FIG. 3 for validating and correcting I/O assignment according to the present invention;

FIG. 10 is a schematic diagram illustrating a method of simulation of the present invention;

FIG. 11 is a series of voltage vs. time and current vs. time charts illustrating the results of the simulation method illustrated in FIG. 10 according to the present invention; and FIG. 12 is a schematic block diagram of a general-purpose computer for practicing the present invention.

DETAILED DESCRIPTION OF THE INVENTION

FIG. 1 is a cross-sectional view of an integrated circuit device according to the present invention. In FIG. 1, an integrated circuit device 100 includes an integrated circuit chip 105 having a multiplicity of chip pads 110 mounted to a package 115 having a multiplicity of package pads 120. Electrical connection between chip pads 110 and package pads 120 is made by solder bumps 125, also known as controlled collapse chip connections (C4s.) Chip pads 110 are electrically connected to circuits in integrated circuit chip 105 and carry power and I/O signals and optionally, I/O test signals.

Package pads 120 are mounted on a top surface 130 of package 115. Mounted to a bottom surface 135 of package 115 are a multiplicity of pins 140. Contained within package 115 are a multiplicity of horizontal power planes 145, for distributing power to from various pins 140 to selected package pads 120 and thence to integrated circuit chip 105. Also contained within package 115 are a multiplicity of horizontal signal I/O planes for routing signals from pins 140 to package pads 120 and thence to integrated circuit chip 105. Therefore, package 110 is an example of a multi-layer ceramic (MLC/pin grid array (PGA) package. One (or more) pin 140 is connected to one (or more) package pad 120 by a package channel 155. Only one channel is illustrated in FIG. 1, but generally, there is one channel for each pin 140 and corresponding package pad 120. In the present example, each signal path includes a pin, a package channel, a package pad, a solder bump and a chip pad. Vertical signal and power connections are made by vias (not illustrated) extending between signal and power planes through openings in power planes 145.

While a particular chip (solder bump) and package (MLC/PGA) combination is illustrated in FIG. 1, the present invention is applicable to other chip and package types in combination. For example, integrated circuit chip 105 may be a wirebond chip or a tape automated bonding (TAB) chip and package 115 may be a ball grid array (BGA), column grid array (CGA), a TAB package or a plastic ball grid array (PBGA) package.

FIG. 2 is a schematic diagram illustrating the delay elements of an electronic system according to the present invention. In FIG. 2, one set of the delay elements of an electronic system 160 include a chip delay in chip 105, a package delay in package channel 155, a printed circuit board delay (PCB) in a PCB 175 and a load delay in a load 180. Chip 105 includes an I/O cell 185, an I/O driver circuit 190 and an interconnect metallurgy path 192. There is one set of delays for each I/O cell 185, I/O driver circuit 190, interconnect metallurgy path 192 and package channel 155 set. Delay affects the estimated arrival times (EATs) of signals from one point in electronic system 160 to another point in the electronic system. Chip delay includes delays through gates in I/O cell 185, delay through devices and gates in I/O driver circuit 190 and delays in interconnect metallurgy path 192. Package channel delay may be modeled as a resistor-inductor-capacitor (RLC) network. Interconnect metallurgy delay may also be modeled as a resistor-inductor-capacitor (RLC) network The delay specification of integrated circuit device 100 includes delays from each set of I/O cell 185, I/O driver circuit 190 and package channel 155.

In addition, to delay, signal EAT's are also affected by SKEW and SLEW in I/O cells 185, SKEW and SLEW in I/O driver circuits 190, SKEW and SLEW in interconnect metallurgy path 192 and SKEW and SLEW in package channel 155. SKEW is the time it takes for a signal to switch states and SLEW is the rate at which a signal can change. Looking in the direction from I/O cell 185 to load 180, the EAT's(I/O) for signals arriving at I/O driver circuit 190 from I/O cell 185 are affected by SKEW and SLEW in the I/O cells. The EAT's(ICM) for signals arriving at interconnect metallurgy path 192 are affected by SKEW and SLEW in I/O Driver circuits 190. The EAT's(PKG) for signals arriving at package channel 155 from interconnect metallurgy path 192 are affected by SKEW and SLEW in the interconnect metallurgy path. The EAT's for signals arriving at PCB 175 from package channel 155 are affected by SLEW and SLEW in the package channel. EAT(PKG) is equivalent to the EAT at chip pad 110, solder bump (C4) 125, or package pad 120. EAT(PCB) is equivalent to the EAT at pin 140.

While not limited to, but a most useful application of the present invention is the case of integrated circuit chip 105 being selected from any number of different chips while package 115 is a standard package to which the chips of different design may be mounted to. A standard package is defined, as one wherein package channels 155 and hence package pad 110 to pin 140 are pre-defined and not changeable.

FIG. 3 is a flowchart illustrating the method of selecting and assigning package channels to I/O cells according to the present invention. In step 195, a package RLC file 200 is created. Package RLC file 200 contains channel length, resistance, inductance, capacitance and time of flight for each channel in package 115. Step 195 is illustrated more fully in FIG. 4 and described below. Package RLC file 200 is illustrated in FIG. 5 and described below. This step is performed only once for each specific package.

In step 205, I/O cells are assigned to package channels based on time of flight data contained in package RLC file 200. The I/O assignments are then written to a cross-reference file (XREF) file 210. XREF file 210 cross-references I/O cells to chip pads and package pins. Step 205 is illustrated more fully in FIG. 6 and described below. XREF file 210 is illustrated in FIG. 7B and described below. A related art XREF file is illustrated in FIG. 7A and described below.

In step 215 validation and correction of the design of integrated chip 105 is performed. Input to step 215 is from a timing constraint file 225 the records of which are modified by time of flight from package RLC file 200 and the output of the step is a timing report 230. Timing constraint file includes the EATs for each I/O cell 185, I/O driver circuit 190, package channel 155 and PCB 175 in electronic system 160.

FIG. 4 is a flowchart illustrating, in more detail, the method of step 195 of FIG. 3 for creating a chip and package RLC file according to the present invention. In step 235 for each package channel 155, channel length, resistance, inductance and capacitance are extracted from the package design. In step 240, based upon the extracted channel length, resistance, inductance and capacitance a time of flight for each package channel is calculated. Time of flight is related to channel length, resistance, inductance and capacitance by the following formula:

$$T_f = \left(\frac{Rwh}{\rho}\right)(LC)^{1/2} \qquad (1)$$

where:

$T_f$ is the time of flight;

R is the resistance of the channel;

w is the height of the wire;

$\rho$ is the resistivity of the wire;

L is the inductance per unit length of the wire; and

C is the capacitance per unit length of the wire.

The term Rwh/I□ may be replaced by the length of the wire. The extraction of channel length, resistance, inductance, capacitance and calculation of time of flight is typically done by a computer running a software program such as Advanced Package Designer (APD) by Cadence Corporation (CA.) Inputs to the APD program include package layout (lines and vias), materials and their physical constants such as resistivity of the wires and the dielectric constant of insulators.

FIG. 5A is an example of package RLC file 200 according to the present invention. Each package channel 155 has its own record (row) in package RLC file 200. Each record includes the package pin ID, the channel length, resistance, inductance, capacitance and time of flight (not shown) for that package channel.

FIG. 5B is an example of an optional chip RLC file 200A according to the present invention. Each chip pad 110 has its own record (row) in RLC file 200A. Each record includes the chip pad ID, the interconnect metallurgy length, resistance, inductance, capacitance and time of flight (not shown) for interconnect metallurgy path 192 Chip RLC file 200A is extracted after interconnect metallurgy path(s) 192 are designed and is used to increase the accuracy of the validation procedure in step 215 of FIG. 3. RLC file 200A may be extracted using various software packages including those provided by Cadence Corporation (CA.)in a manner similar to that used to extract package RLC file 200.

FIG. 6 is a flowchart illustrating, in more detail, the method of step 205 of FIG. 3 for assigning I/O cells to package channels according to the present invention. In step 245, the first/next partition is selected based on user input 250 of the number of I/O cells in each partition and the time of flight range for each partition. As an aid in understanding the present invention an example of wherein I/O cells and package channels are partitioned into four partitions corresponding to four ranges of time of flight will be used. The four partitions of package channels (corresponding to four partitions of I/O cells) are, in increasing package channel time of flight: fast I/O channels (FIO), medium I/O channels (MIO), slow (SIO) I/O channels and not reserved. Any number of partitions may be chosen, the number of partitions being decided by the user based on chip requirements. Generally, only signal I/O cells are considered, power and test I/O cells being excluded, however there may be circumstances where certain power and test I/O cells would be included. Examples of signals reserved for FIOs are signals from fast switching circuits, signals from high fan out circuits, and signals with low SKEW requirements such as clocks, enables, stobes and resets. SIO is reserved for slow switching signals and MIO is reserved for medium switching signals. It should be kept in mind, that for certain signals the user may not want those signals sent or received over fast package channels to avoid racing and other similar conditions.

In the present example there are the three inputted partitions FIO, MIO and SIO. The difference between the total number of signal I/O cells in the chip and the number of FIO, MIO and SIO specified by the user is the number of not reserved package channels, the fourth partition of the present example. Generally, the first partition selected is the partition with the fastest time of flight, in the present example FIO. Next would be MIO, then SIO.

In step 255, an un-flagged package channel (identified by package pin ID in package RLC file 200) is selected from package RLC file 200. Next, in step 260, it is determined if the selected package channel has a time of flight within the range of the current partition. If the selected package channel has a time of flight within the range of the current partition then in step 265, the record of the first/next I/O cell requiring the current partition is marked in XREF file 210, in step 270, a temporary flag is set against the current package channel in PKG RLC file 200 to prevent it being selected again and the method proceeds to step 275. In the present example, if the current partition type is FIO, then the record of the I/O cell in XREF file 210 is marked by placing an FIO in the function column, the package pin ID in the PKG PIN column. If the selected package channel has a time of flight outside of the range of the current partition then the method loops back to step 255.

In steps 255 and 260, a first algorithm for selecting an un-flagged channel is to simply select the next un-flagged package channel. A second algorithm is to select the fastest (or slowest) remaining un-flagged package channel. For example, if there are ten I/O cells requiring FIO package channels and fifteen package channels meet the range requirement for the FIO partition, using the first algorithm the first ten package channels meeting the FIO range criteria would be selected while using the second algorithm, the fastest ten package channels meeting the FIO range criteria would be selected. The same is true for the MIO and SIO cases.

In step 275, it is determined if another I/O cell remains to be assigned a package channel of the current partition range. If another I/O cell remains to be assigned a package channel of the current partition range then the method loops to step 255, otherwise the method proceeds to step 280. It is possible to assign a I/O cell to more than one package channel. For example, by repeating a particuliar cell I/O multiple times in XREF file 210.

In step 280, it is determined if another partition remains. If another partition remains then the method loops to step 245, otherwise the method proceeds to step 285 of FIG. 8.

FIG. 7A is an example of a related art XREF file according to the present invention. Each I/O cell has its own record (row) in XREF file 210A. Each record includes the a chip pad ID, package pin ID and the I/O cell function for that I/O cell.

FIG. 7B is an example of XREF file 210 according to the present invention. XREF file 210 is similar to XREF file 210A except that I/O cells specified by the user to be included in a package channel partition have been assigned to package channels in the FIO, MIO or SIO package partitions. For example, cell "I/O S004" has been assigned to package pin "G27" and the function changed from "SIG" to "FIO." Package pin "G27" connects to one end of a particular channel in the FIO package channel partition and has been assigned to I/O cell "S004." Since the package pad at the other end that particular channel connects to a package pad fixed by the design of the package, the corresponding chip pad, in this example, "AJ01", can be determined. I/O cells not included in package channel partitions are assigned package channels during I/O floor planning. With the assignment of a chip pads to an I/O cells, chip floor planning can proceed and the chip design completed.

FIG. 8 is a flowchart illustrating, in more detail, a first portion of the method of step 215 of FIG. 3 for validating and correcting I/O assignment according to the present invention. In optional step 285, for each I/O cell record in timing constraint file 225, the time of flight from optional chip RLC file 200A is added to EAT(PKG) in order to account for the delay through interconnect metallurgy 192. This allows a more accurate static timing analysis to be performed.

In step 290, the first/next partitioned I/O cell is selected from XREF file 200. In step 295, the corresponding time of flight for the package channel of the selected I/O cell is read from package RLC file 200. Since XREF file 210 and package RLC file 200 both include the package pin ID in their records a cross-reference lookup is easily accomplished. In step 300, the corresponding timing constraint record is selected and EAT(PCB) is read. In step 305, time of flight is added is added to EAT(PCB) from and the corresponding record EAT(PCB) in timing constraint file 225 replaced with the newly calculated EAT(PCB)value. In step 310, it is determined if there is another partitioned I/O cell. If there is another partitioned I/O cell then the method loops to step 290, otherwise the method proceeds to step 315 of FIG. 9. Steps 290 through 310 allow for a more accurate static timing analysis to be performed in subsequent steps by replacing estimated EAT;'s (PCB) with EAT's derived from an RLC analysis of the package channel and optionally and RLC analysis of the chip interconnect metallurgy.)

FIG. 9 is a flowchart illustrating, in more detail, a second portion of the method of step 215 of FIG. 3 for validating and correcting I/O assignment according to the present invention. In step 315, a static timing analysis is performed using the data in timing constraint file 225. Static timing analysis is performed using a software program such as Primetime by Synopys Corporation (CA) or Einstimer an internal software program developed by IBM Corporation (NY.) The result of the timing static timing analysis is a timing report 320. Timing report 320 includes: capacitance and skew analysis, linear combination delay analysis, a standard delay format file, a primary input SLACK report and a timing path endpoint report which includes the cumulative delay of each stage in the path.

In step 325, the report is analyzed to determine which cell I/Os pass and which cell I/Os fail (if any.) In step 330, it is determined if all cell I/Os pass. If all cell I/Os pass then the chip design and package combination are validated and the method terminates. If all cell I/Os do not pass then those cell I/Os are modified in step 335 and the method loops back to step 315. Since the package delay has been modeled from RLC data, the cause of failure must be in the chip.

FIG. 10 is a schematic diagram illustrating a method of simulation of the present invention. In FIG. 10, simulator 337 is used to model the time of flight for partitioned package channels. To reduce complexity that would detract from an understanding of the simulation, only three partitioned channels are represented in FIG. 10. In keeping with the previous example, a FIO, a MIO and a SIO case are simulated. The simulator includes a simulated pulse generator 340 coupled to the input of simulated controlled voltage sources 345. For each case, the output of simulated controlled voltage source 345 is coupled to a portion of a modeled RLC network 350. Modeled network 350 is modeled by a software program such as Advanced Package Designer (APD) by Cadence Corporation (CA.) Within each portion of modeled network 350, for each case, a modeled resistor is coupled to a modeled inductor, which in turn is coupled to a first plate of a modeled capacitor and to the input of a simulation of a chip power supply 355 and to the input of a simulated load current 360. The second plate of the modeled capacitor is coupled to ground. The output of simulated chip power supply, as a voltage, is coupled to a simulated scope 365. The output of simulated load current 360 is coupled to an input of a portion of a modeled load 370 and, as a current, to simulated scope 365. For each case, the portion of the modeled load 370 is modeled as a resistor, inductor and capacitor in parallel and coupled to ground.IG. 11 is a series of voltage vs. time and current vs. time charts illustrating the results of the simulation method illustrated in FIG. 10 according to the present invention. In FIG. 11, chart 375 is a simulated plot of voltage vs. time for a clock pulse applied to each partitioned case (SIO, MIO and FIO) in FIG. 11 as "observed" on simulated scope 365. Chart 380A is a plot of voltage vs. time for a signal on of the SIO case as "observed" on simulated scope 365. The 80% of final voltage is marked with a tick. Chart 385A is a plot of current vs. time drawn by the SIO case as "observed" on simulated scope 365. Chart 380B is a plot of voltage vs. time for a signal on of the MIO case as "observed" on simulated scope 365. The 80% of final voltage is marked with a tick. Chart 385B is a plot of current vs. time drawn by the MIO case as "observed" on simulated scope 365. Chart 380C is a plot of voltage vs. time for a signal on of the FIO case as "observed" on simulated scope 365. The 80% of final voltage is marked with a tick. Chart 385C is a plot of current vs. time drawn by the FIO case as "observed" on simulated scope 365. Notice that 80% of final voltage occurs progressively sooner in time from chart 380A (the SIO case) to chart 380C (the FIO case.)

Table I illustrates the distribution of cell I/Os in an actual related art 728 pin BGA package.

TABLE I

| Cell Type | Pin Count |
|---|---|
| Signal I/O | 480 |
| Test I/O | 64 |
| DC Test I/O | 56 |
| Non I/O | 128 |
| Total | 728 |

Table II illustrates the distribution of cell I/Os in an actual 728 pin BGA package with cell I/Os assigned according to the present invention.

TABLE II

| Cell Type | Pin Count | Time of Flight |
|---|---|---|
| Signal I/O | | |
| No Partition | 360 | |
| FIO | 39 | Min Tf = 60 ps, Max Tf = 129 ps |
| MIO | 42 | Min Tf = 101 ps, Max Tf = 163 ps |
| SIO | 39 | Min Tf = 144 ps, Max Tf = 198 ps |
| Test I/O | 64 | |
| DC Test I/O | 56 | |
| Non I/O | 128 | |
| Total | 728 | |

In Table II, overlap of the ranges of times of flight of the FIO to MIO cases and MIO to SIO cases is caused by differences in the times of flight of the package channels within each partition and differences in the speed of the cell I/Os and I/O diver circuits within each partition.

FIG. 12 is a schematic block diagram of a general-purpose computer for practicing the present invention. Generally, the method described herein with respect to assigning chip I/O's to package channels is practiced with a general-purpose computer and the method may be coded as a set of instructions on removable or hard media for use by the general-purpose computer. In FIG. 12, computer system 400 has at least one microprocessor or central processing unit (CPU) 405. CPU 405 is interconnected via a system bus 410 to a random access memory (RAM) 415, a read-only memory (ROM) 420, an input/output (I/O) adapter 425 for connecting a removable data and/or program storage device 430 and a mass data and/or program storage device 435, a user interface adapter 440 for connecting a keyboard 445 and a mouse 450, a port adapter 455 for connecting a data port 460 and a display adapter 465 for connecting a display device 470.

ROM 420 contains the basic operating system for computer system 400. Examples of removable data and/or program storage device 430 include magnetic media such as floppy drives and tape drives and optical media such as CD ROM drives. Examples of mass data and/or program storage device 435 include hard disk drives and non-volatile memory such as flash memory. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 430, fed through data port 460 or typed in using keyboard 445.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A method of allowing a user to assign I/O cells of an integrated circuit chip to package channels of a package, comprising:

calculating package RLC values for each said package channel in said package; and assigning each I/O cell to one or more said package channels based on said calculated package RLC values of said package channels.

2. The method of claim 1 further including calculating a package time of flight for each said package channel from said package RLC values and performing the assignment of I/O cells to package channels based on said time of flight of each package channel.

3. The method of claim 2 further including:

defining a number of cell I/O partitions, a number of I/O cells in each partition, and a package time of flight range for each partition; and partitioning said package channels into package channel partitions corresponding said cell I/O partitions based on said package time of flight ranges.

4. The method of claim 3, wherein the step of partitioning said package channels includes selecting, for each package channel partition, the package channels having the fastest time of flights within each range of package time of flights.

5. The method of claim 2, further including a static timing analysis of the combination of package and said integrated circuit using the package time of flight of each package channel.

6. The method of claim 5, further including modifying the design of said integrated circuit chip in response to a failure in said timing report.

7. The method of claim 5 further including: calculating chip RLC values and a corresponding chip time of flight for each I/O cell and a corresponding I/O driver combination of said integrated circuit chip; and using said chip times of flight in said static timing analysis.

8. The method of claim 1, wherein said package is a standard package and said package RLC values for each said package channel in said package are predetermined.

9. The method of claim 1, wherein said integrated circuit chip is selected from the group consisting of wirebond chips, solder bump chips and tape automated bonding chips.

10. The method of claim 1, wherein said package is selected from the group consisting of wirebond packages, ball grid array packages, column grid array packages, plastic ball grid array packages and tape automated bonding packages.

11. A computer system comprising a processor, an address/data bus coupled to said processor, and a computer-readable memory unit coupled to communicate with said processor, said memory unit containing instructions that when executed implement a method for allowing a user to assign I/O cells of an integrated circuit chip to package channels of a package, said method comprising the computer implemented steps of:

calculating package RLC values for each said package channel in said package; and assigning each I/O cell to one or more said package channels based on said calculated package RLC values of said package channels.

12. The system of claim 11 further including the computer implemented steps of:

calculating a package time of flight for each said package channel from said package RLC values; and performing the assignment of I/O cells to package channels based on said time of flight of each package channel.

13. The system of claim 12 further including the computer implemented steps of:

defining a number of cell I/O partitions, a number of I/O cells in each partition, and a package time of flight range for each partition; and partitioning said package channels into package channel partitions corresponding said cell I/O partitions based on said package time of flight ranges.

14. The system of claim 13, wherein the computer implemented of step of partitioning said package channels includes selecting, for each package channel partition, the package channels having the fastest time of flights within each range of package time of flights.

15. The system of claim 12, further including the computer implemented step of performing a static timing analysis of the combination of package and said integrated circuit using the package time of flight of each package channel.

16. The system of claim 15, further including the computer implemented step of modifying the design of said integrated circuit chip in response to a failure in said timing report.

17. The system of claim 15 further including the computer implemented steps of: calculating chip RLC values and a corresponding chip time of flight for each I/O cell and a corresponding I/O driver combination of said integrated circuit chip; and using said chip times of flight in said static timing analysis.

18. The system of claim 11, wherein said package is a standard package and said package RLC values for each said package channel in said package are predetermined.

19. The system of claim 11, wherein said integrated circuit chip is selected from the group consisting of wirebond chips, solder bump chips and tape automated bonding chips.

20. The system of claim 11, wherein said package is selected from the group consisting of wirebond packages, ball grid array packages, column grid array packages, plastic ball grid array packages and tape automated bonding packages.

* * * * *